(12) United States Patent
Vieira et al.

(10) Patent No.: US 7,856,222 B2
(45) Date of Patent: Dec. 21, 2010

(54) INTEGRATED BALUN AND COUPLER TRANSFORMER

(75) Inventors: Amarildo C. Vieira, Philadelphia, PA (US); Rudolph J. Menna, Harleysville, PA (US)

(73) Assignee: General Instrument Corporation, Horsham, PA (US)

( * ) Notice: Subject to any disclaimer, the term of this patent is extended or adjusted under 35 U.S.C. 154(b) by 926 days.

(21) Appl. No.: 11/291,725

(22) Filed: Dec. 1, 2005

(65) Prior Publication Data

US 2007/0129043 A1    Jun. 7, 2007

(51) Int. Cl.
*H04B 1/26* (2006.01)
(52) U.S. Cl. .................. 455/326; 455/330; 455/333; 455/191.1; 363/44; 363/17
(58) Field of Classification Search .............. 455/326, 455/330, 333, 191.1; 363/44, 17
See application file for complete search history.

(56) References Cited

U.S. PATENT DOCUMENTS

| 4,707,673 A | * | 11/1987 | Lee et al. ..................... 333/112 |
| 4,885,747 A |   | 12/1989 | Foglia |
| 5,157,786 A | * | 10/1992 | Muterspaugh ............... 455/326 |
| 6,198,644 B1 | * | 3/2001 | Minamisawa ................ 363/44 |
| 6,750,752 B2 | * | 6/2004 | Werlau ....................... 336/229 |

* cited by examiner

*Primary Examiner*—Sanh D Phu
(74) *Attorney, Agent, or Firm*—Larry T. Cullen

(57) ABSTRACT

Integrated balun and coupler is described. In one example, a radio frequency (RF) device includes a balun and coupler. The balun includes a first winding and a second winding arranged on a magnetic core. Respective inputs of the first winding and the second winding are configured to receive a balanced RF input and respective outputs of the first winding and the second winding are configured to provide a first unbalanced RF output. The coupler includes a third winding arranged on the magnetic core. The third winding is configured to provide a second unbalanced RF output, where the second unbalanced RF output is a fraction of the first unbalanced RF output.

16 Claims, 2 Drawing Sheets

INTEGRATED BALUN AND COUPLER TRANSFORMER

BACKGROUND OF THE INVENTION

1. Field of the Invention

The present invention relates to radio frequency (RF) devices and, more particularly, to an integrated balun and coupler transformer.

2. Description of the Background Art

A balun is a device designed to convert between balanced radio frequency (RF) signals and unbalanced RF signals, such as between twin-lead (balanced line) and coaxial cables (unbalanced line). A balun is typically implemented through the use of a small isolation transformer, with the earth ground or chassis ground left floating on the balanced side. In such a configuration, the balun can also perform impedance matching. For example, baluns are used in amplifiers having a push-pull configuration in order to convert the balanced output signal to an unbalanced signal.

A coupler is a transmission device for sampling (through a known coupling loss) the signal in a transmission line. For example, couplers are used in electronic devices, such as amplifiers, to monitor output signal level and feed a sample to the control logic (e.g., automatic gain control (AGC) logic or other type of monitor circuit for further processing).

Some electronic devices, such as the exemplary amplifiers described above, require both a balun and a coupler at their outputs. Conventionally, the balun and the coupler are two separate devices. As such, they take up significant space, contribute added insertion loss, and compromise the output impedance match.

SUMMARY OF THE INVENTION

One aspect of the invention relates to a radio frequency (RF) device having a balun and coupler. The balun includes a first winding and a second winding arranged on a magnetic core. Respective inputs of the first winding and the second winding are configured to receive a balanced RF input and respective outputs of the first winding and the second winding are configured to provide a first unbalanced RF output. The coupler includes a third winding arranged on the magnetic core. The third winding is configured to provide a second unbalanced RF output, where the second unbalanced RF output is a fraction of the first unbalanced RF output.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION OF THE INVENTION

Figure 1:
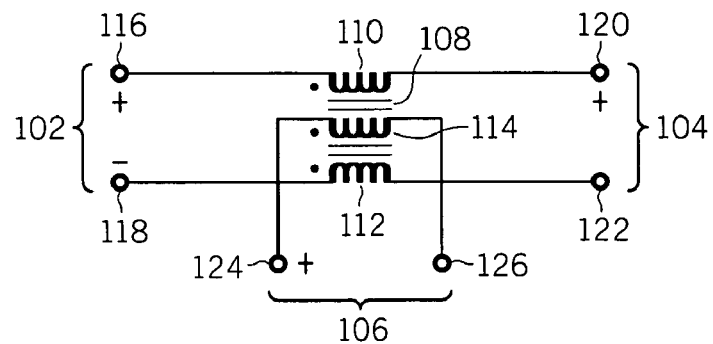
FIG. 1 is a schematic diagram depicting an exemplary embodiment of a radio frequency (RF) device constructed in accordance with one or more aspects of the invention.

FIG. 1 is a schematic diagram depicting an exemplary embodiment of a radio frequency (RF) device 100 constructed in accordance with one or more aspects of the invention. The device 100 includes a balanced RF port 102, an unbalanced RF port 104, an unbalanced RF port 106, a magnetic core 108, and windings 110, 112, and 114. The balanced RF port 102 includes a positive terminal 116 and a negative terminal 118. The unbalanced RF port 104 includes a positive terminal 120 and a ground terminal 122. The unbalanced RF port 106 includes a positive terminal 124 and a ground terminal 126.

The winding 110 is arranged on the magnetic core 108 and coupled between the positive terminal 116 and the positive terminal 120. The winding 112 is arranged on the magnetic core 108 coupled between the negative terminal 118 and the ground terminal 122. The winding 114 is arranged on the magnetic core 108 coupled between the positive terminal 124 and the ground terminal 126. The winding 110 includes N1 turns, the winding 112 includes N2 turns, and the winding 114 includes N3 turns. In one embodiment, N1 is equal to N2 (i.e., the winding 110 has the same number of turns as the winding 112). N3 is less than N1 and N2. In one embodiment, the winding 114 includes a single turn (i.e., N3=1). For example, N1 and N2 may be between 5 and 10 turns, depending on the bandwidth required and the amount of coupling desired.

The balanced RF port 102 is configured to receive a balanced RF input signal. The RF device 100 converts the balanced RF input signal into an unbalanced RF output signal. The unbalanced RF port 104 provides the unbalanced RF output signal via magnetic coupling between the windings 110 and 112 through the magnetic core 108. The unbalanced RF port 106 is configured to provide a sample of the unbalanced RF output signal provided by the unbalanced RF port 104 (i.e., a fraction of the unbalanced RF output signal) via magnetic coupling between the windings 112 and 114 through the magnetic core 108. As is well known in the art, the particular fraction of the unbalanced RF output signal provided at the unbalanced RF port 106 is determined by the ratio of turns between the winding 112 and the winding 114 (e.g., ratio between N2 and N3). The arrangement of the winding 110 and the winding 112 on the magnetic core 108 provides a balun. The arrangement of the winding 114 on the magnetic core 108 provides a coupler. The balun and coupler share the same magnetic core.

The terminals 120 and 122 may comprise a connector (e.g., a coaxial cable connector) or may comprise the ends of the windings 110 and 112, respectively. The terminals 124 and 126 may comprise a connector (e.g., a coaxial cable connector) or may comprise the ends of the winding 114. The terminals 116 and 118 may comprise a connector or may comprise the ends of the windings 110 and 112, respectively.

In this manner, the RF device 100 provides an integrated balun and coupler. The integrated balun and coupler may be used with various types of electronic devices that require conversion from balanced to unbalanced signals and sampling of RF output, e.g., for control purposes. When used with such electronic devices, the integrated balun and coupler of the invention saves space, reduces insertion loss, and reduces cost compared to the use of two separate components.

Figure 2:
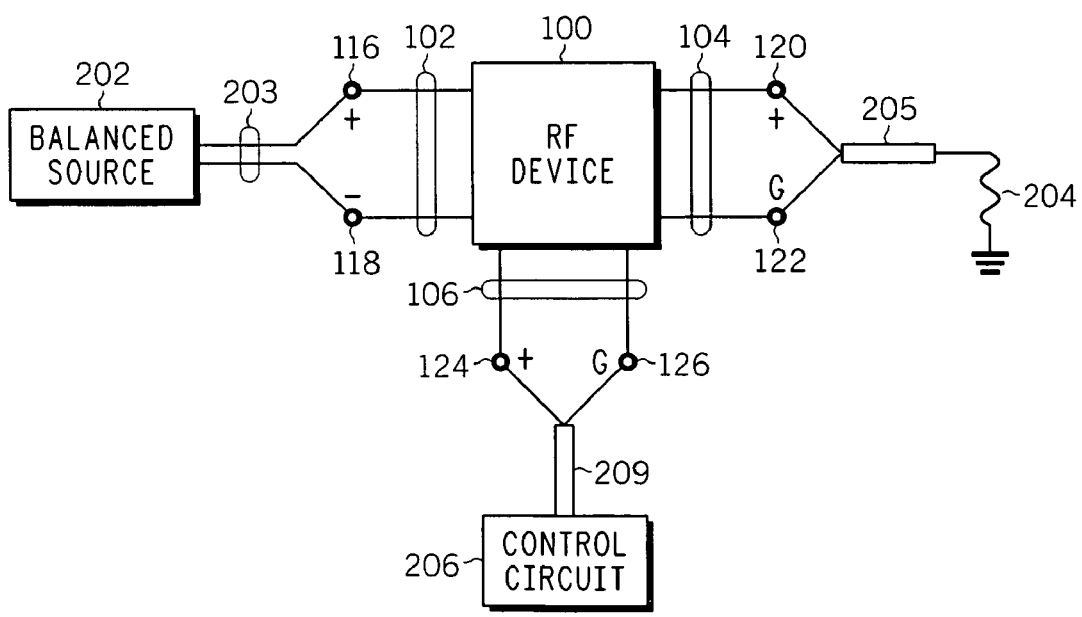
FIG. 2 is a block diagram depicting an exemplary embodiment of an RF system having the RF device of FIG. 1 constructed in accordance with one or more aspects of the invention.

FIG. 2 is a block diagram depicting an exemplary embodiment of an RF system 200 constructed in accordance with one or more aspects of the invention. The RF system 200 includes a balanced source 202, a balanced transmission line 203, an unbalanced transmission line 205, an unbalanced load 204, an unbalanced transmission line 209, a control circuit 206, an integrated balun and coupler (the RF device 100). The balanced source 202 is coupled to the balanced transmission line 203, which is coupled to the balanced RF port 102. The balanced transmission line 203 may comprise a twin-lead transmission line or the like known in the art. The unbalanced load 204 is coupled to unbalanced transmission line 205, which is coupled to the unbalanced RF port 104. The control circuit 206 is coupled to the unbalanced transmission line 209, which is coupled to the unbalanced RF port 106. The unbalanced transmission lines 205 and 209 may comprise coaxial cable or the like known in the art.

The balanced source 202 is configured to provide a balanced RF signal. The balanced RF signal is coupled to the balanced RF port 102 via positive and negative lines of the balanced transmission line 203. The RF device 100 converts the balanced RF signal to an unbalanced RF signal through magnetic coupling between the winding 110 and the winding 112 through the magnetic core 108. The unbalanced RF signal is output from the unbalanced RF port 104. The unbalanced RF signal is coupled to the unbalanced load 204 via positive and ground conductors of the unbalanced transmission line 205. The RF device 100 also samples the unbalanced RF signal through magnetic coupling between the winding 112 and the winding 114 through the magnetic core 108. The sample of the unbalanced RF signal is output from the unbalanced RF port 106. The sample of the unbalanced RF signal is coupled to the control circuit 206 positive and ground conductors of the unbalanced transmission line 209. For example, the RF system 200 may comprise an amplifier driving an unbalanced RF load. The control circuit 206 may comprise automatic gain control (AGC) circuitry for the amplifier.

Figure 3:
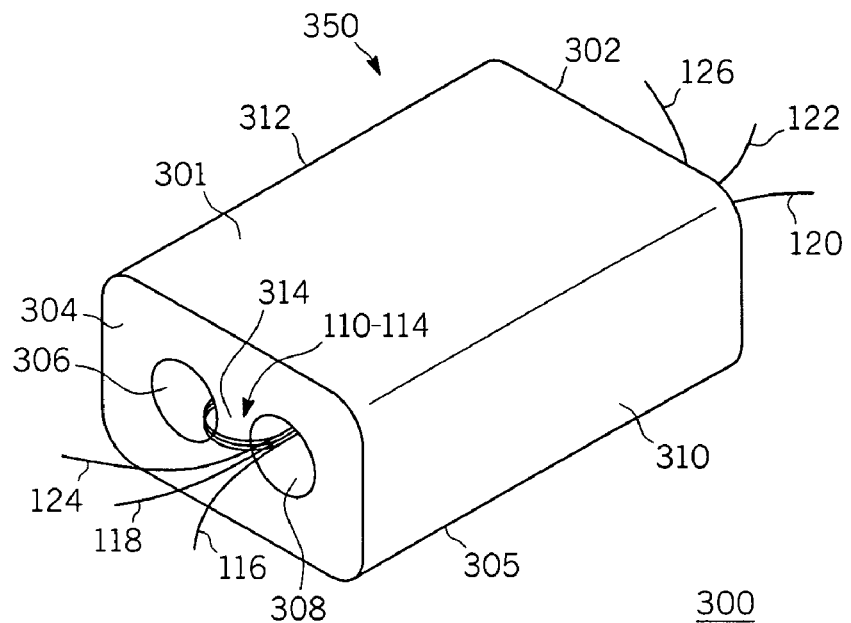
FIG. 3 is a perspective view depicting an exemplary embodiment of a structure for the RF device of FIG. 1 in accordance with one or more aspects of the invention.
Figure 4:
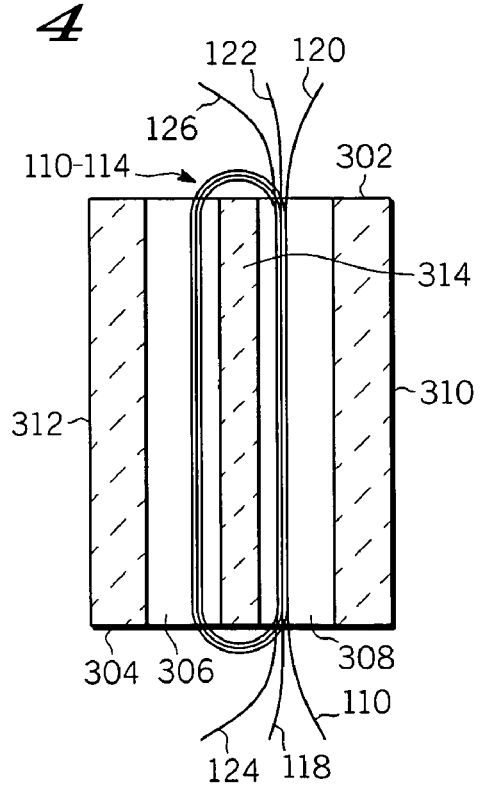
FIG. 4 is a top view of the structure of FIG. 3 with the top removed.

FIG. 3 is a perspective view depicting an exemplary embodiment of a structure 300 for the RF device 100 in accordance with one or more aspects of the invention. In the structure 300, the magnetic core 108 includes a generally body 350 having a top 301, a bottom 305, sides 310 and 312, ends 302 and 304, and bores 306 and 308. The body 350 is generally shaped like a rectangular prism. The body 350 (and hence the magnetic core 108) may comprise ferrite. Each of the bores 306 and 308 traverses the length of the body 350 generally parallel to the sides 310 and 312 between the ends 302 and 304. The bores 306 and 308 are positioned within the body 350 to define a central vane 314. Each of the windings 110, 112, and 114 comprises a transmission line wrapped around the central vane 314 through the bore 306 and the bore 308. FIG. 4 is a top view of the structure 300 with the top 301 removed to reveal the windings 110, 112, and 114 wrapped around the central vane 314. The ends of each of the windings 110, 112, and 114 extend out from either the bore 306 or the bore 308.

While the foregoing is directed to illustrative embodiments of the present invention, other and further embodiments of the invention may be devised without departing from the basic scope thereof, and the scope thereof is determined by the claims that follow.

What is claimed is:

1. A radio frequency (RF) device, comprising:
a balun having a first winding and a second winding arranged on a magnetic core, respective inputs of the first winding and the second winding configured to receive a balanced RF input, and respective outputs of the first winding and the second winding configured to provide a first unbalanced RF output; and
a coupler having a third winding arranged on the magnetic core, the third winding configured to provide a second unbalanced RF output, said second unbalanced RF output being a fraction of the first unbalanced RF output,
wherein a number of turns of the first winding is equal to a number of turns for the second winding, and a number of turns of the third winding is less than the number of turns for the first winding and the second winding.

2. The device of claim 1, wherein the magnetic core comprises a ferrite core.

3. The device of claim 1, wherein the third winding includes at least a single turn.

4. A radio frequency (RF) device, comprising:
a balun having a first winding and a second winding arranged on a magnetic core, respective inputs of the first winding and the second winding configured to receive a balanced RF input, and respective outputs of the first winding and the second winding configured to provide a first unbalanced RF output; and
a coupler having a third winding arranged on the magnetic core, the third winding configured to provide a second unbalanced RF output, said second unbalanced RF output being a fraction of the first unbalanced RF output,
wherein the magnetic core comprises a body having a first end, a second end, a first bore, and a second bore, each of the first bore and the second bore traversing a length of the body between the first end and the second end, the first bore and the second bore positioned to define a central vane.

5. The device of claim 4, wherein each of the first winding, the second winding, and the third winding comprise a conductive wire wrapped around the central vane through the first bore and the second bore.

6. A radio frequency (RF) system, comprising:
a balanced source for providing a balanced RF signal;
an unbalanced load for receiving an unbalanced RF signal;
a circuit for receiving a sample of the unbalanced RF signal;
an integrated balun and coupler having a first winding, a second winding, and a third winding arranged on a magnetic core, respective inputs of the first winding and the second winding configured to receive the balanced RF signal, respective outputs of the first winding and the second winding configured to provide the unbalanced RF signal, and the third winding configured to provide the sample of the unbalanced RF signal,
wherein a number of turns of the first winding is equal to a number of turns for the second winding, and a number of turns of the third winding is less than the number of turns for the first winding and the second winding.

7. The system of claim 6, wherein the magnetic core comprises a ferrite core.

8. The system of claim 6, wherein the third winding includes at least a single turn.

9. A radio frequency (RF) system, comprising:
a balanced source for providing a balanced RF signal;
an unbalanced load for receiving an unbalanced RF signal;
a circuit for receiving a sample of the unbalanced RF signal;

an integrated balun and coupler having a first winding, a second winding, and a third winding arranged on a magnetic core, respective inputs of the first winding and the second winding configured to receive the balanced RF signal, respective outputs of the first winding and the second winding configured to provide the unbalanced RF signal, and the third winding configured to provide the sample of the unbalanced RF signal, wherein the magnetic core comprises a body having a first end, a second end, a first bore, and a second bore, each of the first bore and the second bore traversing a length of the body between the first end and the second end, the first bore and the second bore positioned to define a central vane.

10. The system of claim 9, wherein each of the first winding, the second winding, and the third winding comprise a conductive wire wrapped around the central vane through the first bore and the second bore.

11. A radio frequency (RF) device, comprising:
- a balanced RF port having a positive terminal and a negative terminal;
- a first unbalanced RF port having a positive terminal and a ground terminal;
- a second unbalanced RF port having a positive terminal and a ground terminal;
- a magnetic core;
- a first winding arranged on the magnetic core and coupled between the positive terminal of the balanced RF port and the positive terminal of the first unbalanced RF port;
- a second winding arranged on the magnetic core and coupled between the negative terminal of the balanced RF port and the ground terminal of the first unbalanced RF port; and
- a third winding arranged on the magnetic core and coupled between the positive terminal and the ground terminal of the second unbalanced RF port;
- wherein a number of turns of the first winding equals a number of turns of the second winding, and a number of turns of the third winding is less than the number of turns for the first winding and the second winding.

12. The device of claim 11, wherein the magnetic core comprises a ferrite core.

13. The device of claim 11, wherein the third winding includes at least a single turn.

14. The device of claim 11, wherein the magnetic core comprises a body having a first end, a second end, a first bore, and a second bore, each of the first bore and the second bore traversing a length of the body between the first end and the second end, the first bore and the second bore positioned to define a central vane.

15. The device of claim 14, wherein each of the first winding, the second winding, and the third winding comprise a conductive wire wrapped around the central vane through the first bore and the second bore.

16. The device of claim 11, wherein the positive terminal of the balanced RF port and the positive terminal of the first unbalanced RF port comprise respective ends of the first winding, the negative terminal of the balanced RF port and the ground terminal of the first unbalanced RF port comprise respective ends of the second winding, and the positive terminal and the ground terminal of the second unbalanced RF port comprise respective ends of the third winding.

* * * * *